US010434661B2

(12) United States Patent
Bonora

(10) Patent No.: US 10,434,661 B2
(45) Date of Patent: *Oct. 8, 2019

(54) WORKPIECE SUPPORT STRUCTURES AND APPARATUS FOR ACCESSING SAME

(71) Applicant: Brooks Automation, Inc., Chelmsford, MA (US)

(72) Inventor: Anthony C. Bonora, Fremont, CA (US)

(73) Assignee: Brooks Automation, Inc., Chelmsford, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/875,890

(22) Filed: Jan. 19, 2018

(65) Prior Publication Data

US 2018/0141219 A1    May 24, 2018

Related U.S. Application Data

(63) Continuation of application No. 14/452,490, filed on Aug. 5, 2014, now Pat. No. 9,878,453, which is a continuation of application No. 13/337,028, filed on Dec. 23, 2011, now Pat. No. 8,800,774, which is a continuation of application No. 11/483,366, filed on Jul. 7, 2006, now abandoned.

(60) Provisional application No. 60/697,528, filed on Jul. 8, 2005.

(51) Int. Cl.
*B25J 15/00* (2006.01)
*H01L 21/673* (2006.01)
*H01L 21/687* (2006.01)
*B65G 65/00* (2006.01)

(52) U.S. Cl.
CPC .......... *B25J 15/0028* (2013.01); *B65G 65/00* (2013.01); *H01L 21/67383* (2013.01); *H01L 21/68707* (2013.01)

(58) Field of Classification Search
CPC ................. B25J 15/0028; B65G 65/00; H01L 21/67383; H01L 21/68707; Y10S 414/135
USPC .......................................... 294/213; 414/941
See application file for complete search history.

(56) References Cited

U.S. PATENT DOCUMENTS 5,700,046 A * 12/1997 Van Doren ............ B25J 15/026
                                                        294/119.1
5,782,361 A *  7/1998 Kakizaki ............. H01L 21/6732
                                                        206/454
5,810,935 A *  9/1998 Lee .................... H01L 21/68707
                                                        118/500

(Continued)

FOREIGN PATENT DOCUMENTS

DE            10314383 A1 * 10/2004    ....... H01L 21/68707

*Primary Examiner* — Gabriela M Puig
(74) *Attorney, Agent, or Firm* — Penilla IP, APC

(57) ABSTRACT

A workpiece container stores at least one workpiece having a bottom surface and a peripheral edge. In one embodiment, a workpiece support structure is located within the container enclosure, which forms multiple vertically stacked storage shelves within the enclosure. Each storage shelf includes, in one embodiment, a first tine and a second tine for supporting the workpiece in a substantially horizontal orientation. The bottom surface and peripheral edge of a workpiece seated on a storage shelf extends beyond the outer edge of both the first tine and the second tine. An end effector may engage these extended portions or "grip zones" of the workpiece.

20 Claims, 9 Drawing Sheets

(56) References Cited

U.S. PATENT DOCUMENTS

| | | | | |
|---|---|---|---|---|
| 6,010,008 A * | 1/2000 | Nyseth | H01L 21/67369 | 206/454 |
| 6,340,090 B1 * | 1/2002 | Jahani | H01L 21/67057 | 118/500 |
| 6,390,754 B2 * | 5/2002 | Yamaga | H01L 21/67259 | 414/217 |
| 6,591,960 B2 * | 7/2003 | Babbs | B25J 15/0206 | 198/346.2 |
| 6,729,462 B2 * | 5/2004 | Babbs | B25J 15/0206 | 198/346.2 |
| 8,585,112 B2 * | 11/2013 | Kawakami | H01J 37/20 | 294/119.1 |
| 8,800,774 B2 * | 8/2014 | Bonora | H01L 21/67383 | 206/710 |
| 8,807,616 B2 * | 8/2014 | Yamanaka | B25J 15/008 | 294/213 |
| 2002/0089655 A1 * | 7/2002 | Kida | G03F 7/70691 | 355/72 |
| 2004/0126220 A1 * | 7/2004 | Howell | H01L 21/67379 | 414/800 |
| 2007/0029227 A1 * | 2/2007 | Bonora | H01L 21/67383 | 206/711 |
| 2007/0128008 A1 * | 6/2007 | Morikawa | H01L 21/67742 | 414/217 |
| 2007/0289844 A1 * | 12/2007 | Fukazawa | H01L 21/67155 | 198/465.1 |
| 2009/0101067 A1 * | 4/2009 | Bonora | H01L 21/67766 | 118/503 |
| 2014/0227072 A1 * | 8/2014 | Lee | H01L 21/6838 | 414/744.3 |

\* cited by examiner

WORKPIECE SUPPORT STRUCTURES AND APPARATUS FOR ACCESSING SAME

CLAIM OF PRIORITY

This application is a continuation of and claims priority, under 35 USC § 120, to U.S. patent application Ser. No. 14/452,490, filed on Aug. 5, 2014, and entitled "Workpiece Support Structures and Apparatus for Accessing Same", which is a continuation of and claims priority, under 35 USC § 120, to U.S. patent application Ser. No. 13/337,028, filed on Dec. 23, 2011, issued as U.S. Pat. No. 8,800,774 on Aug. 12, 2014, and entitled "Workpiece Support Structures and Apparatus for Accessing Same", which is a continuation of and claims priority, under 35 USC § 120, to U.S. patent application Ser. No. 11/483,366, filed on Jul. 7, 2006, and entitled "Workpiece Support Structures and Apparatus for Accessing Same", which claims priority, under 35 U.S.C. § 119(e), to U.S. Provisional Patent Application No. 60/697,528, entitled "End Effector Tine and Transfer Methods," which was filed on Jul. 8, 2005, all of which are incorporated herein by reference herein in their entirety.

FIELD

The present disclosure generally comprises workpiece support structures and a workpiece transfer apparatus for accessing the workpieces stored in the structures. More specifically, the present disclosure comprises a structure for supporting the workpieces such that the transfer device may randomly access any of the workpieces stored in the carrier.

BACKGROUND

Conventional wafer containers, such as a Front Opening Unified Pod (FOUP) or a Standard Mechanical Interface (SMIF) pod, often contain shelves of fixed-pitch spacing to support the semiconductor wafers. FIG. 1 illustrates one embodiment of a conventional FOUP 10. The FOUP 10 includes a housing or shell 12 and a FOUP door 14 that mechanically couples with the FOUP shell 12. The housing 12, which includes a top 18, a back 20, a first side 22, a second side 24 and a bottom 26, defines an enclosure 28. The enclosure includes a support 30 located on the interior surface 32 of the first side 22 and the interior surface (not shown) of the second side 24. Each support 30 includes multiple shelves 16. Each slot between a pair of shelves 16 stores a single wafer. Each support 30 covers a portion of the wafer's peripheral edge while the wafer is seated in the FOUP 10. Access to the outside edge of the wafer is blocked by the shelf structure. Wafers are therefore typically handled by thin-bladed end effectors that must reach between adjacent wafers and subsequently either secure the wafer with a vacuum chuck or some type of edge support and/or gripping arrangement. These methods of securing the wafer often support the wafer by the wafer's back and front edges or elsewhere on the back edges.

This conventional wafer securing approach has been in widespread use in the semiconductor manufacturing industry for over twenty-five years. But this approach has a number of shortcomings that become more serious as the wafer size becomes larger. Also, increasing use is being made of thinned wafers, which are prone to significant bending deflections when supported by the edge.

Some of the deficiencies of conventional wafer support and carrier architectures include:

1) Wafer Mapping—Break-the-beam mapping has proven to be the most reliable method of determining a wafer's presence or absence and its vertical position within the container. However, break-the-beam mapping with the 300 mm FOUP architecture requires expensive and complex mechanisms to position sensing elements into the container.

2) End effector blade travel zone—To access a wafer, the end effector blade must first travel between adjacent wafers until it reaches a desired position, and at that position, lift the wafer from the support shelf. As wafer diameter increases, the mass of the wafer and the blade length required to support the wafer also increases. To maintain reasonable deflection characteristics of the end effector for larger diameter wafers, the end effector blade must be thicker. If the thickness of the end effector blade increases, the pitch between the wafers must also increase to allow the thicker end effector to pass between wafers without contacting the wafers. Either container size will have to increase or fewer wafers can be stored in conventional containers. Additionally, the extra travel length of the end effector is subject to wafer bow, distortion and warping, as well as the vibration characteristics of the end effector due to the rapid horizontal and vertical motions required for time efficient wafer handling. All of this must be accomplished without any accidental contact between a moving end effector and a wafer. Contact between the end effector and a wafer will likely to cause serious damage to sensitive circuits on the wafer as well as generating particle bursts that may contaminate all the other wafers in the container.

3) End effector travel path efficiency—A conventional end effector places a wafer in a container and then withdraws to enable vertical motion clearance for randomly accessing the next wafer, which is then withdrawn and taken to a process or metrology location. Thus, four horizontal moves are required for each wafer exchange at the container.

4) Process/Metrology chuck complexity—Typically, wafers are placed on flat chucks or platens for processing or measurement. In many applications, the wafer is secured to the chuck (and planarized) by applying vacuum. Use of conventional vacuum or edge grip end effectors necessitates large cutaway areas in the chuck to enable release of the wafer and withdrawal of the end effector blade.

5) Multiple wafer handling—It is very difficult in today's architecture to pick or place multiple wafers simultaneously or to enable individual selection of desired wafers in a mass transfer mode.

Thus, it would be advantageous to have an end effector with these features. The various embodiments of an end effector and a tine structure described herein provide such features.

SUMMARY OF THE INVENTION

One aspect of the present disclosure is to provide a new apparatus for supporting semiconductor wafers or substrates. In one embodiment, the present disclosure comprises a structure that enables storage and transport of one or more wafers as well as random access pick and place handling of individual wafers or groups of wafers.

Another aspect of the present disclosure is to provide a tine structure that supports each wafer by a pair of cantilevered structures. In one embodiment, the pair of cantilevered structures each includes two contact surfaces for supporting the wafer; one contact surface at the distal end and the other contact surface at the proximal end. While a wafer is seated on the cantilever structures, the peripheral edge of the wafer is exposed or accessible by an end effector. A portion of the wafer's bottom surface is also exposed or accessible by an end effector, and in one embodiment is referred to as a "grip zone." In another embodiment, each cantilever structure includes a third contact surface.

Yet another aspect of the present disclosure is to provide a tine structure whereby an end effector may travel along the outside of the support structure between wafers. In one embodiment, the pair of cantilevered structures are spaced apart such that a portion of a wafer, seated on the cantilever structures, extends out beyond the outer edge of each cantilever structure. An end effector according to the present disclosure may then travel between wafers along the outside of each wafer; eliminating the need to travel across the entire wafer surface simply to lift a wafer off the support shelves. In one embodiment, the end effector travels along the outside of the wafer until the end effector is at a height whereby the end effector arms can be positioned underneath the wafer. This distance, by way of example only, comprises a few millimeters, and does not require the end effector to travel across the wafer surface.

DETAILED DESCRIPTION

Figure 1:
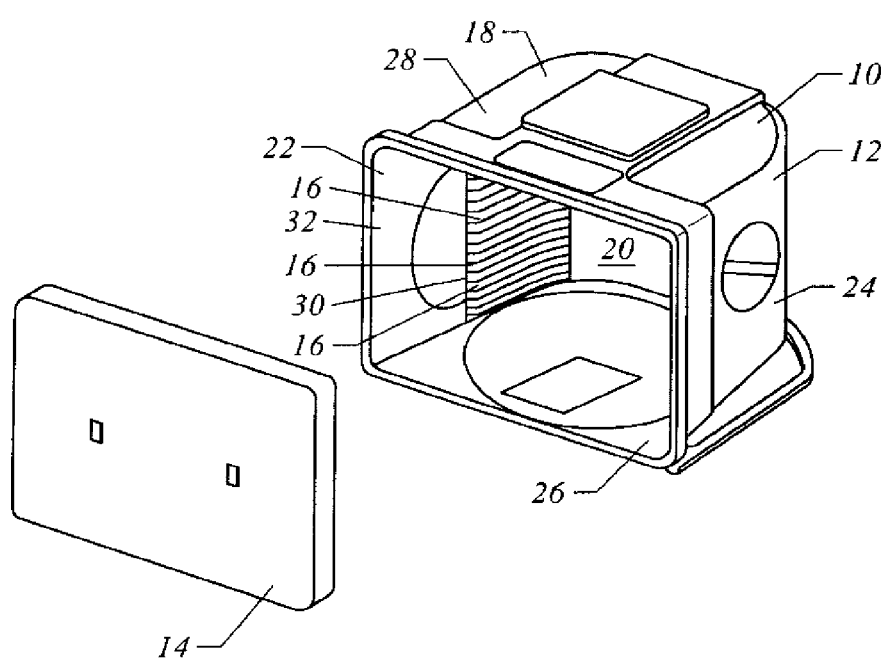
FIG. 1 provides a perspective view of a FOUP, according to the prior art.

For the purposes of describing this invention only, the workpiece support structure 102 will be described in reference to a carrier or container. A container or carrier may include, but is not limited to, a moveable, closed or open structure used to hold, store, transport or protect semiconductor wafers, substrates, flat panel displays and the like. Such a container includes, but is not limited to, a wafer cassette, a Standard Mechanical Interface (SMIF) pod, and a Front Opening Unified Pod (FOUP). For containers that include mechanically openable doors, the present disclosure may be used in conjunction with front opening and/or bottom opening containers. Of course, the workpiece support structure 102 is not limited to such containers and may be used in conjunction with any type of workpiece storage needs.

FIGS. 2 and 4-8 illustrate one embodiment of a support structure 102. In this embodiment, each support structure 102 includes a base member 104 and multiple tines 106. Each tine 106 forms a cantilevered structure extending or projecting from the base member 104. A tine 106 may comprise any shape including, but not limited to, a flat surface, a shape having a rectangular cross-sectional area, a shape having a circular cross-sectional area, and so on. FIG. 2A illustrates that each tine 106 is separated by a distance dl, which in a preferred embodiment, comprises 10 mm. The distance dl may comprise other distances as well. There is no ideal distance dl. The distance dl simply must be large enough such that a wafer W may be vertically lifted off a storage shelf (e.g., tines 106b1 and 106b2 in FIG. 4) to a height whereby the wafer W may be removed from the storage shelf, and the wafer does not contact the storage shelf located directly above (e.g., tines 106a1 and 106a2 in FIG. 4).

FIGS. 4-8 illustrate the support structure 102 in use with a bottom opening container. The base member 104 shown in FIG. 4 extends upward from the container door 12. The base member 104 may comprise a structure separate from the container door 12 or may comprise a structure that is part of the container door 12.

Figure 4:
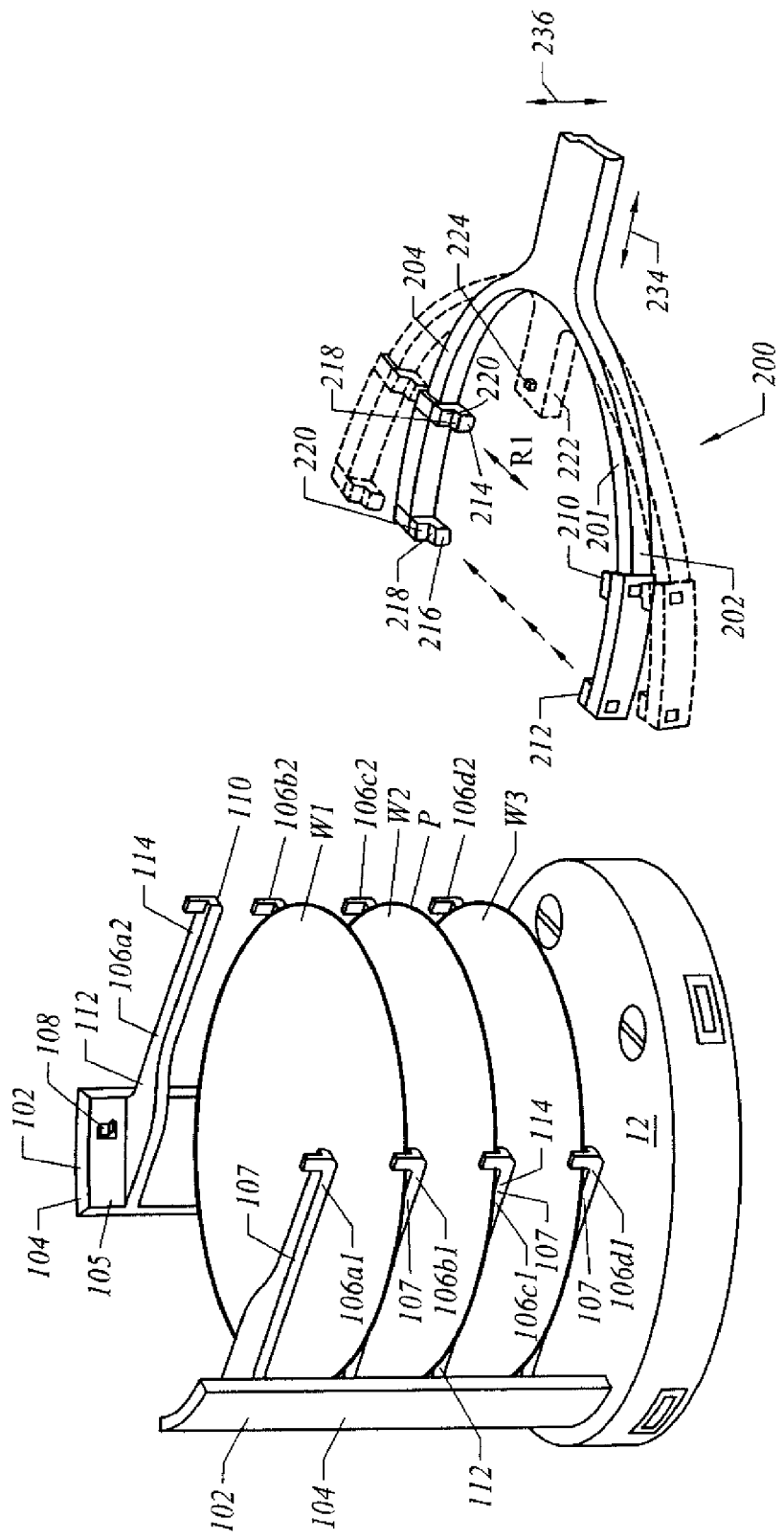
FIG. 4 provides a perspective view of another embodiment of the present disclosure.

Any number of tines 106 may extend or project from a base member 104, and the number of tines 106 simply determines how many wafers may be stored in a carrier if the support structure is located within a carrier (each pair of tines 106, or storage shelf, supports a single wafer). For example, the wafer supports 102 shown in FIG. 4 each include a base member 104 and four tines 106. Thus, the support structure 102 shown in FIG. 4 may store up to four wafers W. Each wafer W is supported by a pair of tines 106, which may be referred to as a storage shelf. FIG. 4 illustrates that the uppermost pair of tines 106a1 and 106a2 are not occupied by a wafer; tines 106b1 and 106b2 are supporting wafer W1; tines 106c1 and 106c2 are supporting wafer W2; and tines 106d1 and 106d2 are supporting wafer W3. Each pair of tines 106 preferably support the wafer W in a substantially horizontal orientation so that the wafers W are substantially parallel to each other. FIG. 4 shows that the tines 106 are molded into the base member 104. Each tine 106 may also comprise a separate component affixed or secured to the base member 104.

Figure 2A:
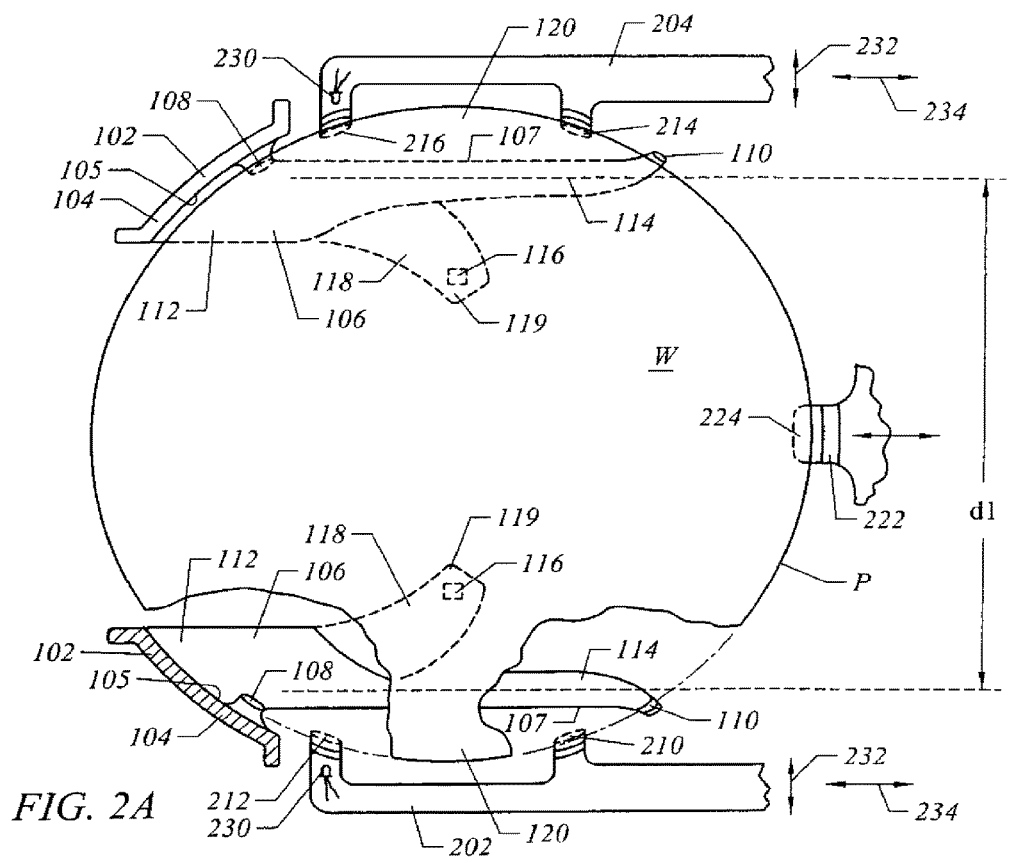
FIGS. 2A-2B provide a cross-sectional plan view and a side elevation view of an embodiment of the present disclosure.
Figure 2B:
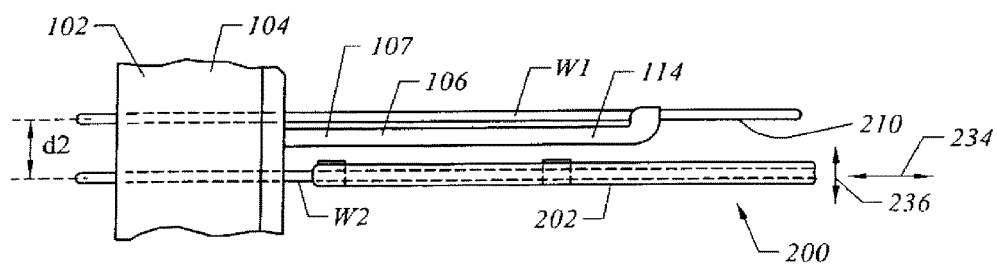

FIG. 2A illustrates that a tine 106 includes a first end or proximal end 112, a second end or distal end 114 and an outer edge 107. If the support structure 102 is located within a FOUP, the outer edge 107 of each tine 106 faces the interior of the container shell 12 (e.g., surface 32 of a FOUP side wall 22—as shown in FIG. 1). The tines 106 preferably support a wafer W with a minimum amount of contact with the wafer's bottom surface or peripheral edge P. In this embodiment, each tine 106 contacts or supports the wafer W with only two surfaces—a first support 108 and a second support 110. The first support 108 is located at or near the first end 112 of the tine 106. The second support 110 is located at or near the second end 114 of the tine 106. It is within the scope of the present disclosure for other portions of the tine 106 to contact the wafer W. In addition, the first and second supports 108 and 110 may be located elsewhere along the tine 106. It is also within the scope of the present disclosure for a tine 106 to have only one support while other supports are provided by the base member 104. In a preferred embodiment, each storage shelf includes at least three supports shared between the base member(s) 104 and the two tines 106.

FIG. 2A further illustrates that a tine 106 may also include an additional support 116. In the FIG. 2A embodiment, a structure 118 extends from the tine 106 somewhere between the proximal end 112 and the distal end 114 of the tine 106. The additional support 116 is preferably located at the distal end 119 of the structure 118, but may, of course, be located anywhere along the structure 118. The additional support 116 provides an additional support point, and may be desirable when, for example, the support structure 102 is storing thin wafers.

Unlike the storage shelves in a conventional container, the tine 106 supports a wafer, yet enables access to the wafer's perimeter P located between the two support pads 108 and 110. FIG. 2A shows that the wafer's perimeter P, and an area 120 of the wafer W, extend out beyond the tine 106 between the support pads 108 and 110. The area 120 of the wafer W that extends beyond, or overhangs, the tine 106 is referred to as a "grip zone." The grip zone 120 provides an access area for an end effector or other mechanical apparatus to contact or grip the wafer W while the wafer W is seated on the pair of tines 106. The grip zone 120 is created because the distance d1 between the pair of tines (e.g., tines 106a1 and 106a2) is less than the diameter D of the wafer W. Thus, each tine 106 passes under the wafer W.

Accessing wafers stored in a FOUP or SMIF pod with a conventional end effector requires many complicated, precise movements. First, the end effector is inserted into the FOUP storage area to a predetermined position that aligns the end effector with the wafer it is going to remove from the FOUP. To get to this predetermined position, the end effector travels between adjacent wafers (e.g., wafers W1 and W2 in FIG. 2B) towards the back of the FOUP. The entire time, the end effector is within millimeters of the wafer surface. The end effector then rises up; contacting the bottom surface of the wafer, and proceeds to raise up until the wafer is lifted completely from the shelf. The end effector, with a wafer seated upon it, is then removed from the container without contacting either of two adjacent shelves or the adjacent wafer. The end effector operates within this narrow area (e.g., between the two adjacent shelves) the entire time, and must not damage the wafer (e.g., contacting either shelf).

A conventional end effector must travel within this narrow area between adjacent wafers twice when the end effector drops off a wafer in the FOUP and then immediately travels to another wafer within the FOUP. For example, to drop off a wafer within the FOUP, the end effector travels into the FOUP and lowers the wafer onto a storage shelf. The end effector then retracts out of the FOUP; traveling out of the FOUP between two adjacent wafers. Once the end effector clears the wafers, the end effector shifts in a vertical direction and is inserted between two different adjacent wafers. The end effector then repeats the same movements to remove the new wafer from the FOUP. The end effector may accidentally strike or contact a wafer and damage the wafer while traveling between the wafers.

If the support structures 102 are located in a container (e.g., a FOUP), the present disclosure eliminates the need for an end effector to travel across the entire face of the wafer simply to position its support pads under the wafer. At the very least, the end effector has to travel across only a very small portion of each wafer to position its support pads. By creating the "grip zones" 120, an end effector may travel vertically within the FOUP enclosure along the outside of the wafer's perimeter or peripheral edge. When, for example, an end effector reaches the appropriate height to engage a wafer, the end effector arms only have to move a small distance towards the wafer until the end effector's support pads are positioned to support the wafer and lift the wafer off the storage shelf. The end effector does not have to travel across the entire face of the wafer to lift the wafer off the support shelf.

FIGS. 2A and 4 illustrate one embodiment of an end effector 200. An end effector may comprise any structure that acquires, supports and transports a wafer or any other article (e.g., reticle, FPD, etc.), and is conventionally driven by, or attached to, a robotic mechanism (e.g., robotic arm). An end effector may passively acquire a wafer (e.g., end effector include tines) or actively acquire a wafer (e.g., end effector includes a gripper mechanism that moves between a wafer loading position and a wafer contact position). In this embodiment, the end effector 200 includes a first arm 202 and a second arm 204. The first arm 202 includes a first support pad 210 and second support pad 212. The second arm 204 includes a first support pad 214 and second support pad 216. In a preferred embodiment, three or more support pads support a wafer. For example, the first arm 202 may have two supports pads and the second arm 204 may have one support pad, or vice versa. The first and second support pads 210 and 212 on the first arm 202, and the first and second support pads 214 and 216 on the second arm 204, are spaced apart from each other. It is within the scope of the present disclosure for the end effector 200 to include two or more support pads shared between the two arms 202 and 204.

The first and second support pads 210 and 212 on the first arm 202, and the first and second support pads 214 and 216 on the second arm 204, may be passive supports or active supports. If the supports are passive, the support pads 210-216 remain in the position shown in FIG. 4 at all times. In this case, a wafer W remains on the support pads 210-216 by gravitational forces. If the support pads 210-216 are active supports, at least one support, and preferably each support, moves between a wafer loading position and a wafer gripping position. The wafer loading position allows the wafer to be seated on the end effector. After the wafer is seated on the end effector, the support pads moves towards the center of the wafer until the support pads contact the peripheral edge of the wafer.

The configuration of the end effector 200 and the arms 202 and 204 shown in FIGS. 2A and 4 are only for illustration purposes. The end effector 200 may have other configurations and the arms 202 and 204 may, for example, include only one support pad each or incorporate a break-the-beam sensor system 230. A break-the-beam sensor is known within the semiconductor manufacturing art and is often used to accurately map the true position of each wafer stored in the container to provide error-free, scrape-free placement and retrieval of wafers at random access positions. Such a sensor system is well known within the art and therefore does not require further disclosure herein.

In effect, the conventional end effector blade is eliminated; the end effector does not travel within the interstitial spaces between wafers. The arms 202 and 204 of the end effector structure may have any reasonable thickness as required for minimizing deflection and controlling vibration. The support pads 210 and 212 on the first arm 202 and the support pads 214 and 216 on the second arm 204 may be passive retention/support surfaces or activated retention surfaces with motion in the direction 232. If the end effector arms 202 and 204 cannot move in the direction 232, the end effector 200 first travels in the direction 234 beneath the wafer until the support pads 210, 212, 214 and 216 are located substantially underneath the wafer's "grip zone" 120. The end effector 200 then moves vertically (e.g., direction 236 in FIG. 2B) to engage the bottom surface 20 of the wafer W and lift the wafer W a controlled amount off the storage shelf. The end effector 200 can then withdraw the wafer W from the container.

If the end effector 200 has arms 202 and 204 that move in the direction 232, the end effector 200 can freely travel in the vertical direction 236 unimpeded by the presence or absence of wafers stored in the container. In this case, the distance between the arms 202 and 204, while each are located in a retracted position, must be greater than the diameter D of each wafer stored in the container. In operation, the end effector 200 travels first in the direction 234 until the supports of each arm 202 and 204 are substantially vertically aligned with the "grip zone" 120 of a wafer stored in the container. The end effector 200 travels in the vertical direction 236 until the arms 202 and 204 are located at a desired wafer level. The arms 202 and 204 extend towards the wafer until the support pads 210, 212, 214 and 216 are located substantially in the positions shown in FIG. 1A. The end effector 200 moves upward in the vertical direction 236, lifting the wafer W off the tines 106 prior to removing the wafer W from the container in the direction 234.

Figure 3:
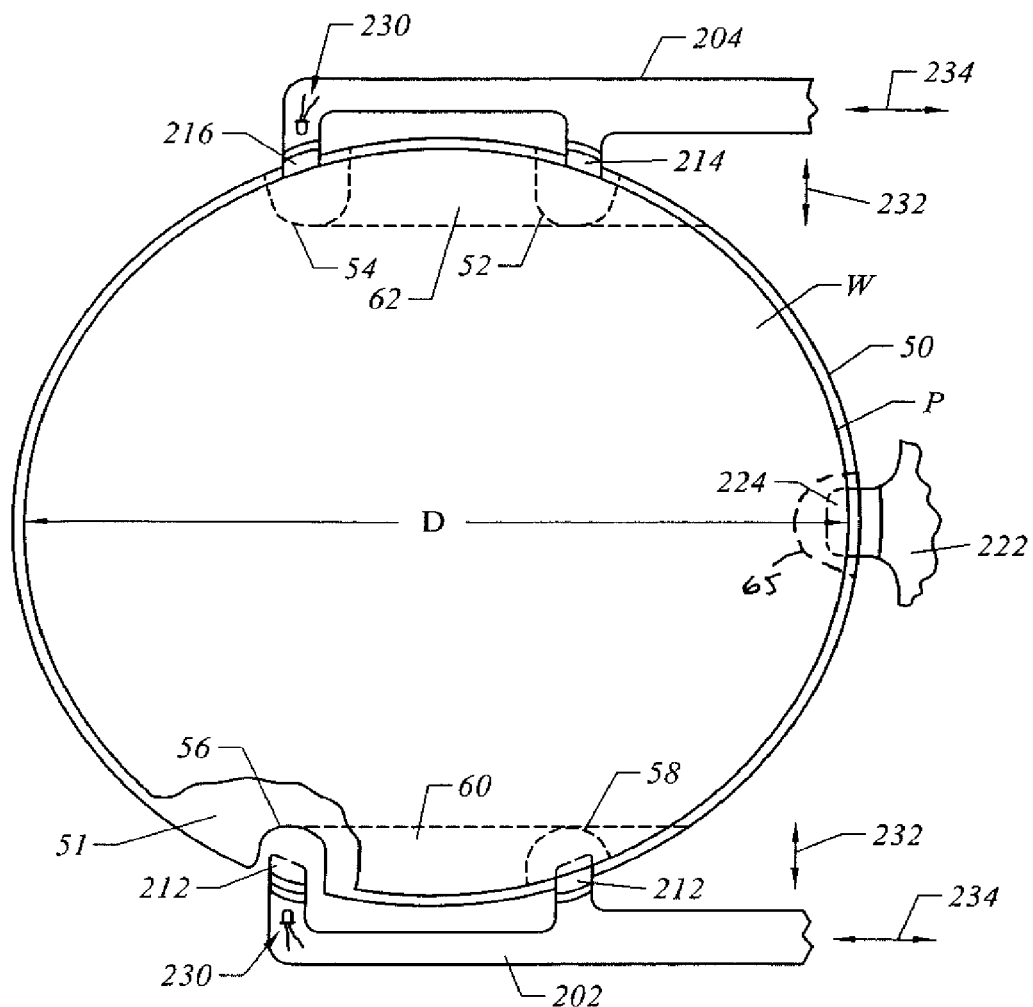
FIG. 3 provides a plan view of another embodiment of the present disclosure.

FIG. 3 illustrates the end effector 200 shown in FIG. 2A in operation with a wafer chuck 50. The wafer chuck 50 illustrates that other semiconductor devices may accommodate the end effector 200. In particular, the wafer chuck 50 includes four relief channels 52, 54, 56 and 58. Each relief channel is aligned such that the end effector 200 may lower the wafer W onto the chuck 50 and no contact the wafer chuck 50. Once the wafer W is seated on the chuck 50, the end effector arms 202 and 204 move laterally away from the chuck 50 in the direction 232 and then retracts from the chuck 50 in the direction 234.

FIGS. 4-8 illustrate various embodiments of an end effector. FIG. 4 illustrates one embodiment of an end effector 200 with passive fingers. The end effector 200 includes a body 201 having a first arm 202 and a second arm 204. The first and second arms 202 and 204 are shown in FIG. 4 as curved structures. The body 201 and arms 202 and 204 may have different shapes. The support pads 210, 212, 214 and 216 are each shown having a flat contact surface 218 for contacting the bottom surface of the wafer and a backstop surface 220 that, in effect, prevents the wafer from sliding off the contact surface 218. Each support pad may have different shaped contact surfaces that minimize the amount of contact between the contact surface 218 and the wafer. The end effector 200 is shown having an optional third finger 220 to provide additional support. The third finger 222 includes a wafer contact surface 224.

In operation, the end effector 200 is positioned such that, when the end effector 200 moves towards the wafer in direction 234, the fingers 202 and 204 move under the grip zone 120 of the wafer to be removed from the container. The end effector 200 moves forward until the contact surfaces 218 of the support pads 210, 212, 214 and 216 are located in substantially the position shown in FIG. 2A. At this point, the end effector 200 moves upward until the wafer is initially seated on the contact surfaces 218, and continues to move upward until the wafer is raised off the storage shelf (e.g., pair of tines 106). The end effector 200 then retracts in the direction 234 until the wafer is removed from the container.

Figure 5:
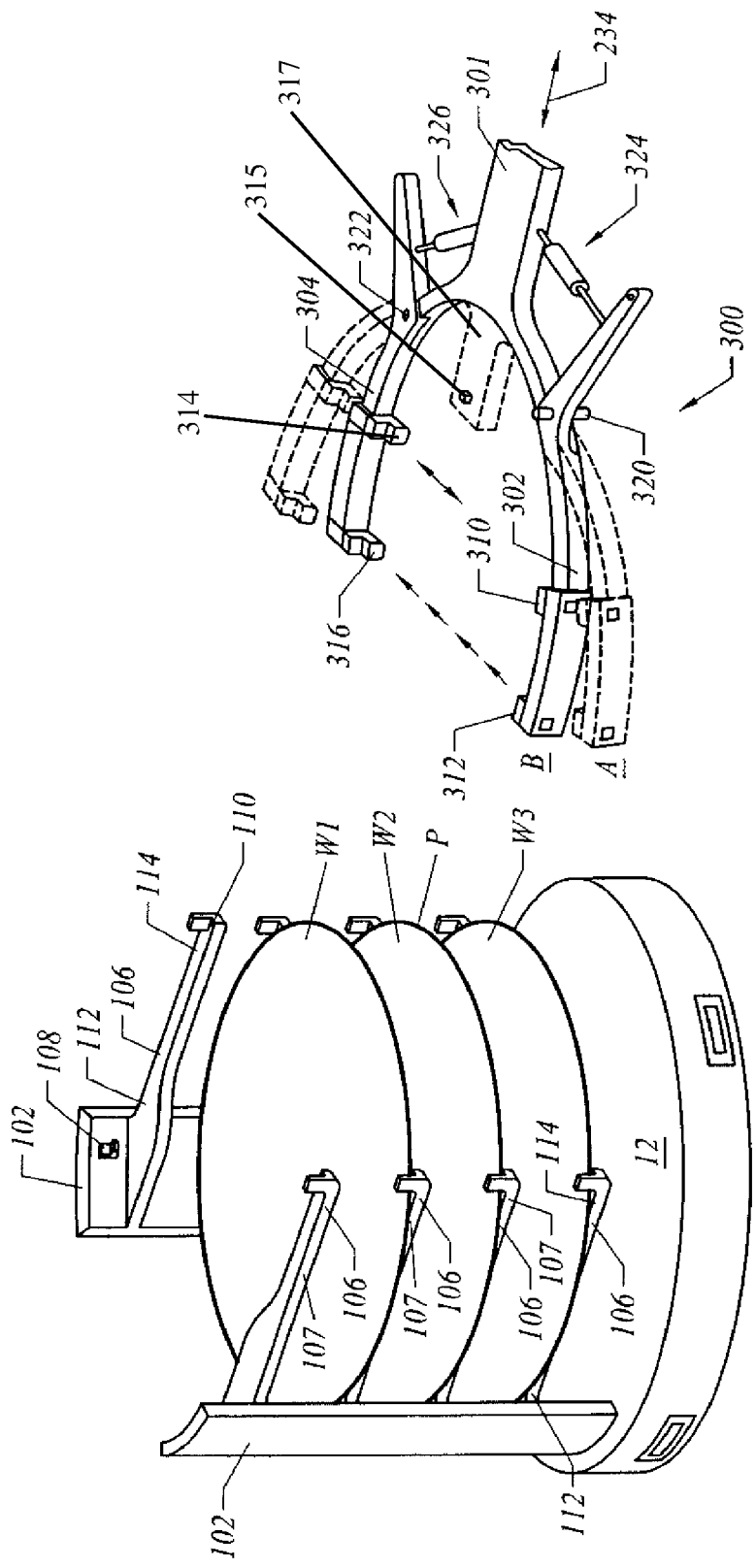
FIG. 5 provides a perspective view of yet another embodiment of the present disclosure.

FIG. 5 illustrates another embodiment of an end effector 300. The end effector 300 includes a first arm 302 and a second arm 304. The first arm 302 has a first support pad 310 and a second support pad 312. The second arm 304 has a first support pad 314 and a second support pad 316. The end effector 300 may also include a third arm 317 having a support pad 315, which provides additional support.

FIG. 5 illustrates that each arm is pinned to the end effector body 301. The first arm 302 pivots with respect to the end effector body 301 about a pivot pin 320. The second arm 304 pivots with respect to the end effector body 301 about a pivot pin 322. Each arm may be affixed to the end effector body 301 by other mechanical devices that allow the arms to rotate with respect the end effector body 301. In this embodiment, the first arm 302 is rotated about pivot pin 320 by an actuator 324, while the second arm 304 is rotated about the pivot pin 322 by an actuator 326. FIG. 5 illustrates that the first arm 302 moves between a retracted position A and a workpiece support position B. The second arm 304 also moves between a retracted and workpiece support position.

With the first and second arms 302 and 304 each in a retracted position (e.g., position A), the end effector 300 may travel vertically within the container enclosure between wafers because the arms 302 and 304 move between the outer edge 107 of each tine 106 and the interior of the container wall. Thus, the end effector 300 moves vertically between wafers in the direction 236 without having to move in the direction 234 at all—reducing the travel time between wafers. In operation, the end effector 300 stops at a wafer "pick" location. The arms 302 and 304 move to position B, which places the support pads 310, 312, 314 and 316 underneath the wafer. The end effector 300 rises until the wafer is seated on the support pads, and continues to rise to lift the wafer off the storage shelf. The end effector 300 then retracts and removes the wafer out of the container enclosure 28.

Figure 6:
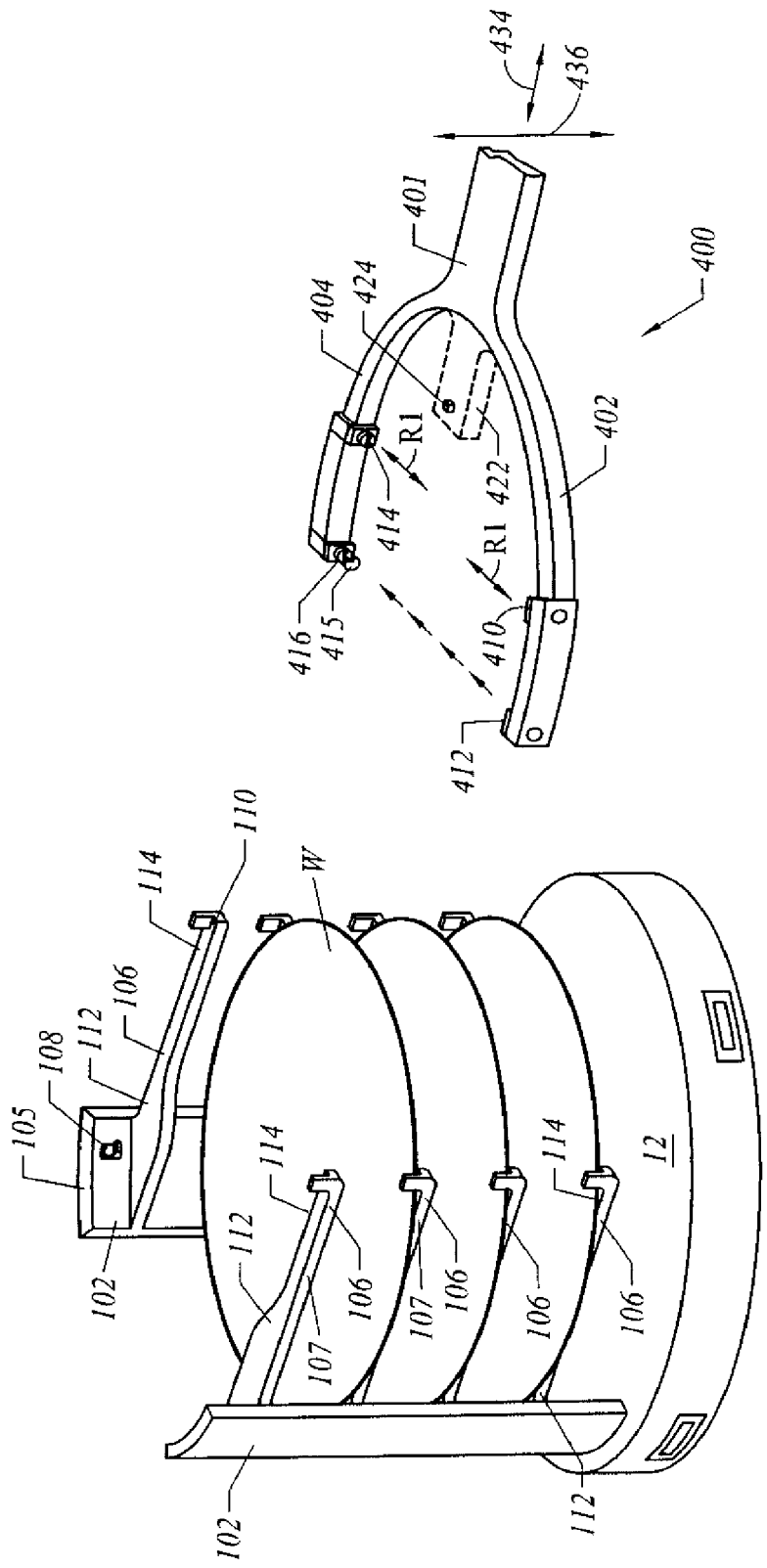
FIG. 6 provides a perspective view of still another embodiment of the present disclosure.

FIG. 6 illustrates another embodiment of an end effector 400. The end effector 400 includes a body 401 having a first arm 402 and a second arm 404. The first and second arms 402 and 404 are shown in FIG. 6 as curved structures. The arms 402 and 404 may have different shapes. The support pads 410, 412, 414 and 416 are each shown as a cylindrical actuator having a slot 415. The support pads 410-416 may have other shapes. The end effector 400 is shown having an optional third finger 420 with a support pad 424 for additional support.

In operation, the end effector 400 moves along directions 434 and 436 until the support pads 410-416 are positioned adjacent a wafer W. At this point, the support 410-416 move in the direction R1 towards the wafer W until each support pad contacts the peripheral edge of the wafer W and effectively grips the wafer. In this embodiment, the wafer's peripheral edge P fits into the slot 415 of each support pad. The end effector 400 then moves upward along direction 436 to raise the wafer W off the storage shelf. The end effector 400 then retracts in the direction 434 until the wafer is removed from the container enclosure.

Figure 7:
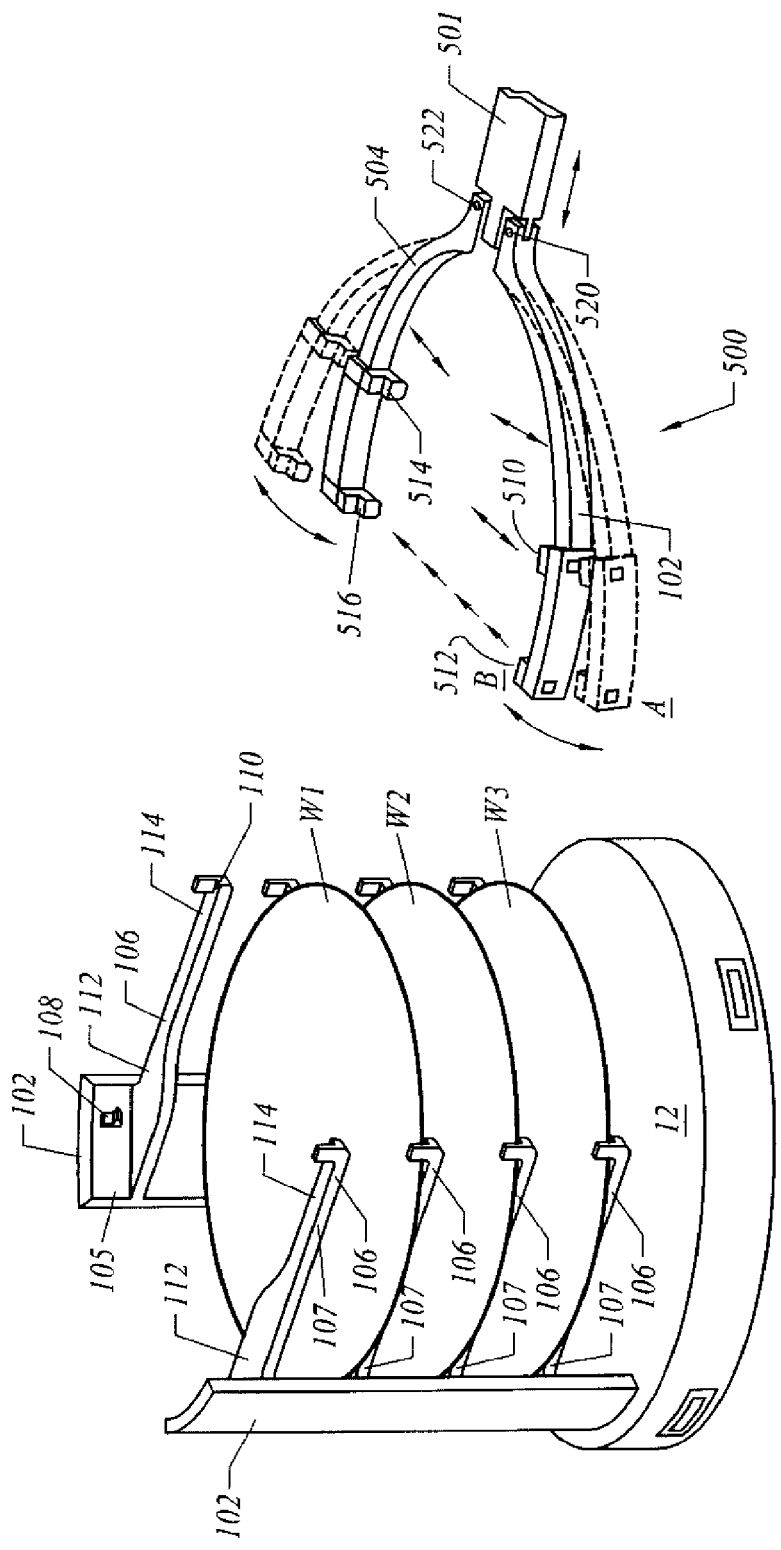
FIG. 7 provides a perspective view of another embodiment of the present disclosure.

FIG. 7 illustrates another embodiment of an end effector 500. The end effector 500 includes a first arm 502 and a second arm 504. The first arm 502 has a first support pad 510 and a second support pad 512. The second arm 504 has a first support pad 514 and a second support pad 516.

FIG. 7 illustrates that each arm is pinned to the end effector body 501. The first arm 502 pivots with respect to the end effector body 501 about a pivot pin 520. The second arm 504 pivots with respect to the end effector body 501 about a pivot pin 522. Each arm may be affixed to the body 501 by other mechanical devices that allow the arms to rotate with respect the end effector body 501. The first arm 502 moves between a retracted position A and a workpiece support position B. The second arm 504 also moves between a retracted position A and workpiece support position B (not shown).

Figure 8:
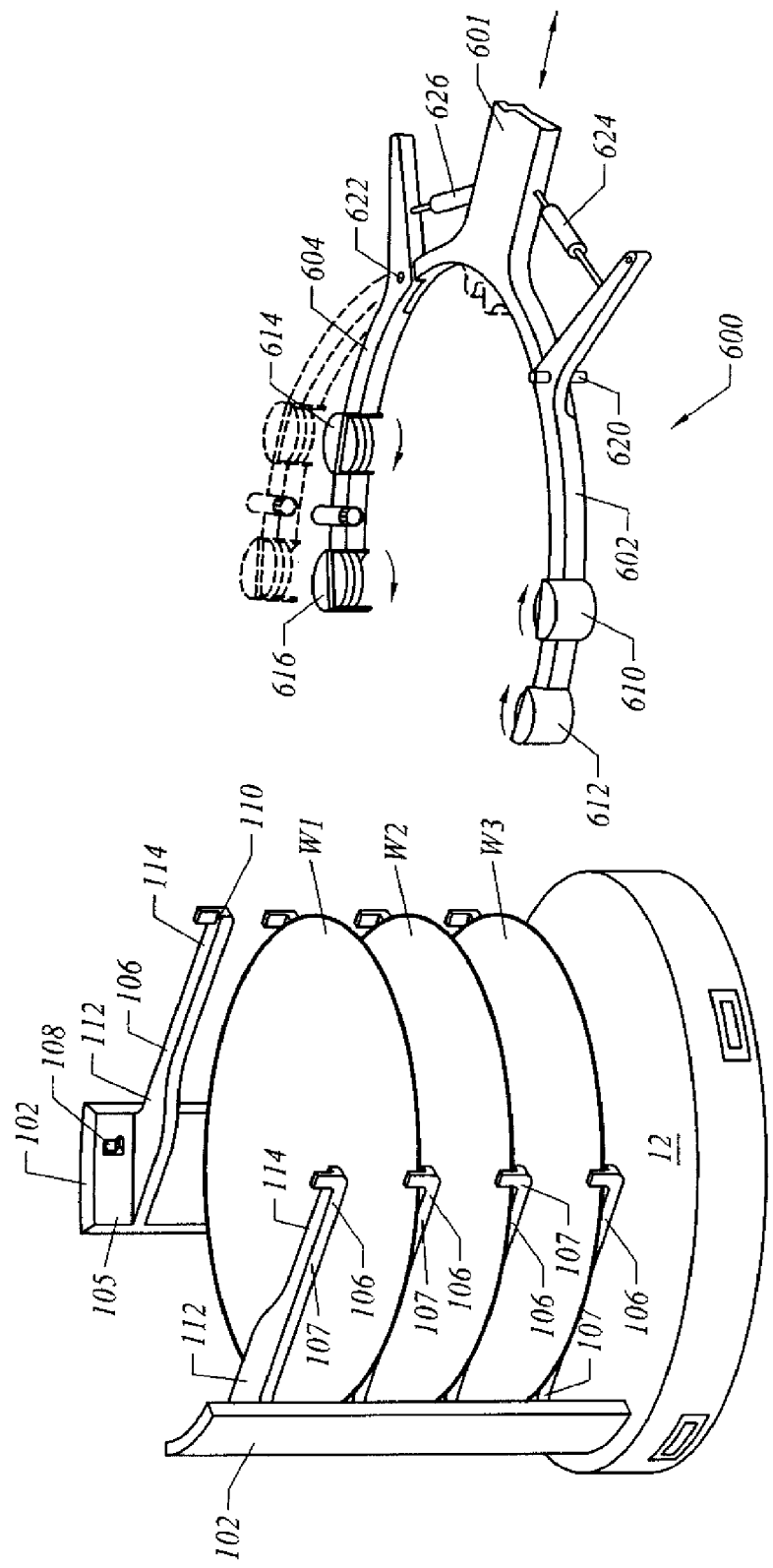
FIG. 8 provides a perspective view of yet another embodiment of the present disclosure.

FIG. 8 illustrates an end effector 600. In this embodiment, the end effector 600 is capable of rotating a wafer seated on the end effector 600 about the wafer's center. The end effector 600 includes a first arm 602 and a second arm 604. The first arm 602 includes a first support pad 610 and a second support pad 612. The second arm 604 includes a first support pad 614 and a second support pad 616. Each support pad, in this embodiment, comprises a rotatable support mechanism for rotating a wafer seated on the end effector 600.

In this embodiment, the first arm 602 is rotatably attached to the end effector body 601 by a pin 620. The second arm 604 is rotatably attached to the end effector body 601 by a pin 622. A first actuator 624 rotates the first arm 602 about the pin 620. A second actuator 626 rotates the second arm 604 about the second pin 622. Thus, the first and second arms 602 and 604 rotate between position A and position B. The arms 602 and 604 may be rotatably secured to the body 601 in other manners.

It is often necessary to rotate the wafer W about its vertical centerline axis to read, for example, identification codes or to align the geometrical fiducials, including notches, in the wafer perimeter P. The end effector 600 shown in FIG. 8 is only an exemplary embodiment of an end effector with rotatable support pads 610, 612, 614 and 616 for rotating the wafer W on the end effector 600. Likewise, the mechanism used for reading identifying marks on the top or bottom surfaces of the wafer perimeter can be enabled by utilizing an imaging device (camera) or other reading means mounted on the end effector. Accomplishing this "in-situ" saves time and floor space, and reduces cost and mechanism complexity.

The various embodiments of the end effectors described herein allow the arms of the end effector to move vertically external to the wafer's peripheral edge P. Thus, almost all of the wafer support surface of a process or metrology tool chuck may be used to support the wafer and does not need, in large part, to accommodate the end effector blade (e.g., arms and body). FIG. 3 illustrates one embodiment of a metrology or process tool chuck 50 in operation with the end effector 200. In this embodiment, the chuck 50 includes a body 62 having a wafer support surface 51, four indentations or channels to accommodate each support pad, a first slot 60 and a second slot 63. FIG. 3 illustrates a wafer W seated directly on the surface 51. It is also within the scope of the invention to have lift pins, or other support structures, extending from the surface 51 for supporting the wafer W above the surface 51. The wafer W may be secured on the support surface 51 (or other support structure) by any method known in the art including, but not limited to, vacuum, gravity or electrostatic attraction.

To accommodate the arms 202 and 204 of the end effector 200, the chuck body 62 includes a recessed area or channel to allow each arm to pass through the chuck body 62 after the end effector 200 places the wafer on the surface 51. For example, the chuck body 62 includes a recessed surface 52 to allow the support pad 214 pass through the chuck body 62, a recessed surface 54 to allow the support pad 216 pass through the chuck body 62, a recessed surface 56 to allow the support pad 212 pass through the chuck body 62, and a recessed surface 58 to allow the support pad 210 pass through the chuck body 62. In operation, the end effector 200 places the wafer W on the surface 51 and keeps traveling vertically downward into the chuck body 62. The end effector must retract from the chuck 50 to allow the chuck to spin the wafer W. If the arms 202 and 204 cannot move away from the chuck body 62 in the direction 232, the end effector would not be able to retract from the chuck 50 in the direction 234. In one embodiment, each recessed surface travels completely through the chuck body 62 such that the end effector may effectively pass through the bottom surface of the chuck body 62 and then retract in the direction 234 away from the chuck 50.

Alternately, the chuck body 62 includes a first horizontal slot 60 and a second horizontal slot 63 each located at a predetermined elevation below the surface 51. The slots allows the end effector to lower the arms 202 and 204 to an elevation aligned with the slots 60 and 63, and subsequently retract in the direction 234 away from the chuck 50 through the slots 60 and 63. Arm 202 passes through the chuck body 62 within the slot 60 and the arm 204 passes through the chuck body 62 within the slot 63. If the end effector 200 includes a third arm 222 (as shown in FIG. 3), the chuck body 62 includes a fifth recessed surface 65 to accommodate the third arm 222. In operation after the end effector 200 places the wafer W on the surface 51 the end effector continues to travel vertical downward and the arm 222 will pass through the body 62 within the recessed surface 65. Each recessed surface in the chuck body 62 takes away a small amount of the support surface 51. However, the reduction in the support surface 51 due to the recessed surfaces is minimal.

In semiconductor processing, wafers often have a starting thickness of 0.7 mm-1.0 mm. The wafers are then thinned to a thickness of less than 0.3 mm at some intermediate stage of the total manufacturing process sequence. The thinned wafer is very flexible and fragile, and the historical methods of wafer edge support in a container as well as the conventional edge gripping methods, are not adequate.

Each storage shelf supports a wafer at multiple points. In particular, each storage shelf preferably supports a wafer by at least three contact points or support pads. In one embodiment, a storage shelf, which comprises two tines 106, includes a single support pad on each tine 106 (e.g., support pad 110) and a support pad located on each base member 104 (e.g., support pad 108)—all at substantially the same elevation in order to support a wafer in a horizontal orientation. In another embodiment, each tine 106 includes an additional support pad (e.g., support pad 116) to provide additional support. Of course, each tine 106 and/or base member 104 may include additional support pads. The number and geometry of additional support pads for both the end effector and the storage shelves is limited only by the requirement for the end effector to interact with each tine 106.

Figure 9:
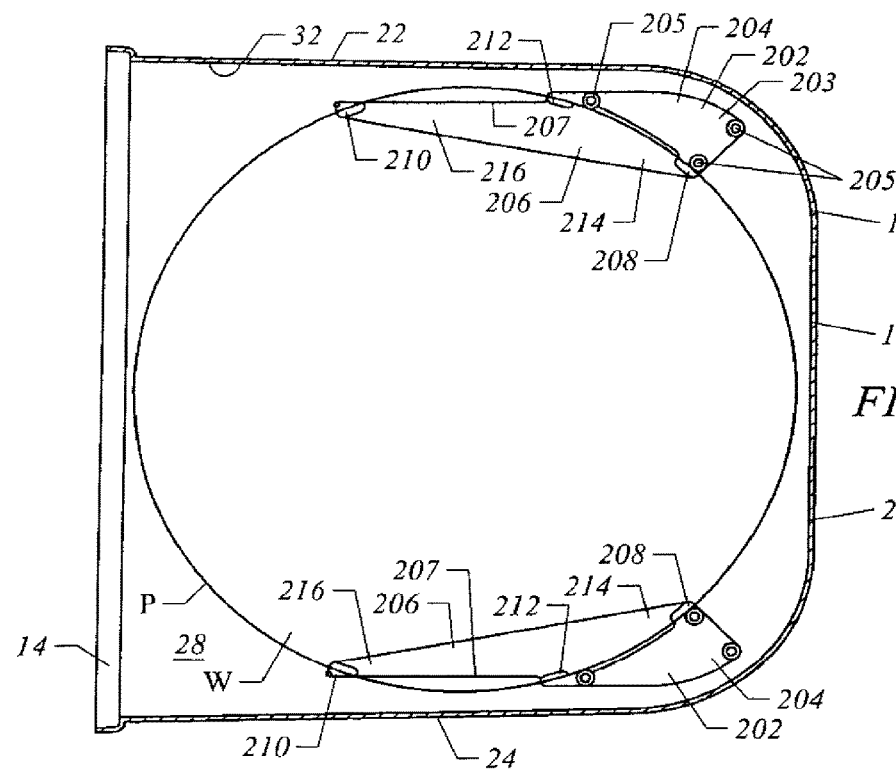
FIG. 9 provides a plan view of yet another embodiment of the present disclosure.

FIG. 9 illustrates one embodiment of a wafer support structure 202 within a conventional FOUP 10. The FOUP 10 includes a housing or shell 12 and a FOUP door 14 that mechanically couples with the FOUP shell 12. The housing 12, which includes a top 18, a back 20, a first side 22, a second side 24 and a bottom 26, defines an enclosure 28.

In this embodiment, the support structures 202 are affixed to the top 18 and bottom 26 of the FOUP shell 12. For example, the top end 203 of each support structure 202 is affixed to the top 18 of the FOUP shell 12 by three fixtures 205. The bottom end (not shown) of the support structure 202 is fixed to the bottom 26 of the FOUP shell 12. It is also within the scope of the present disclosure for the support structures 202 to be affixed to either the top 18 or the bottom 26 of the FOUP shell 12, or be affixed to the FOUP shell 12 by other methods. Each support structure 202 may also be molded with the FOUP shell 12. For example, each base member 204 may be molded into the back 20 of the FOUP shell 12, or any of the other surfaces of the FOUP shell 12 (e.g., top 18, bottom 26, first side 22, second side 24, etc.). In another embodiment, the support structure 202 may not include a base member 204. Instead, each storage shelf comprises one or more tines 206; each affixed or molded into the FOUP shell 12. For example, the proximal end 214 of each tine 206 may include a pair of tabs that lock into a pair of slots located in the back 20 of the FOUP shell 12. FIG. 9 illustrates that the two support structures 202 comprise two separate structures. However, any portion of the support structures 202, such as the base members 204 and/or tines 206, may comprise a single piece of material.

FIG. 9 illustrates one embodiment of a storage shelf, comprising a pair of tines 206, for exemplary purposes. Each tine 206 extends or projects from the base member 204. The tine 206 includes a first end or proximal end 214 and a second end or distal end 216. The combination of the two tines 206 and the base members 204 support a single wafer W with six support pads—two support pads 208, two support pads 210 and two support pads 212. The support pad 210 is located at or near the distal end 216 of each tine 206. The other four support pads 208 and 212 may be located on either the proximal end 214 of the tine 206 or the base members 204, or a combination of the two. It is within the scope of the present disclosure for other portions of the tine 206 to contact the wafer W or for the support pads to be located in other positions.

FIG. 9 illustrates that the wafer's peripheral edge P, and a portion of the wafer W, overhangs or extends beyond the outer edge 207 of each tine 206 between the support pads 210 and 212—while the wafer W is seated on the storage shelf. As discussed above, this overhanging portion of the wafer W is referred to as the "grip" or "access" area that may be engaged by an end effector while the wafer W is seated in the FOUP 10.

Figure 10:
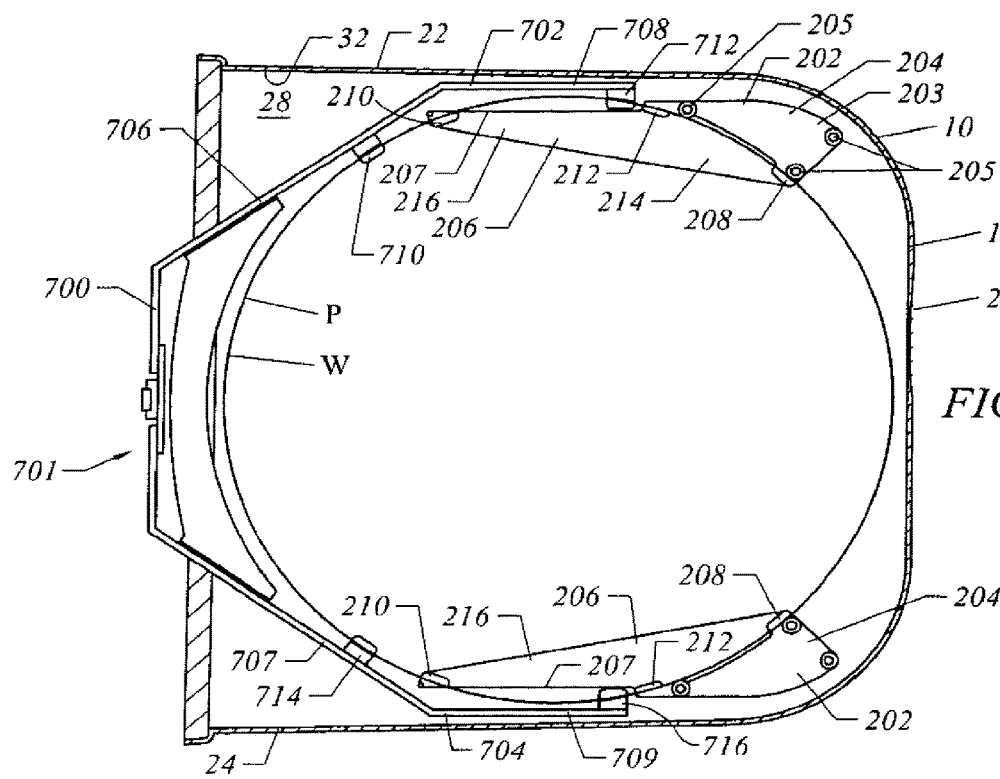
FIG. 10 provides a cross-sectional plan view of the container shown in FIG. 10 in conjunction with one embodiment of an end effector according to the present disclosure.

FIG. 10 illustrates an end effector 700 inserted into the FOUP 10. The end effector 700 includes a body 701, a first arm 702 and a second arm 704. The body 701 may be connected to, by way of example only, a robotic arm for moving the end effector body 701 through any number of movements (e.g., six degrees of freedom motion). The first arm 702 has a proximal end 706 and a distal end 708. The second arm 704 includes a proximal end 707 and a distal end 709.

The FIG. 10 embodiment of the end effector 700 includes two support pads on each arm. The first arm 702 includes a support pad 710 located a the proximal end 706 and a second support pad 712 located at the distal end 708. The second arm 704 includes a support pad 714 located the proximal end 707 and a support pad 716 located at the distal end 709. Each arm may include any number of support pads, and each support pad may be located anywhere along the end effector's arms. It is preferable that the support pads do not interfere with the support structure 202. FIG. 10 illustrates each support pad 710-716 as a passive pad. Alternately, each support pad 710-716 may comprise an active pad similar to the end effector embodiments shown in FIGS. 4-8.

When the end effector 700 is placed into the FOUP enclosure 28, the arms 702 and 704 contour around the wafer's peripheral edge P—as shown in FIG. 10. In a preferred embodiment, the distance between the wafer's peripheral edge P and each side of the FOUP shell 12, such as the first side 22 and the second side 24, is large enough so that the arms 702 and 704 of the end effector 700 may travel vertically within the enclosure 28 without contacting any part of the support structure 202 or the wafer W or the FOUP shell 12. It is also within the scope of the present disclosure for this distance to be minimal (as shown in FIG. 10) such that arms 702 and 704 of the end effector 700 may not travel vertically within the enclosure 28 without contacting any part of the support structure 202 or the wafer W.

Thus, after setting a wafer on a storage shelf, the end effector 700 would have to travel out of the enclosure, and raise/lower to another elevation before the end effector 700 can be inserted back into the enclosure 28.

Unlike a conventional end effector, the arms 702 and 704 preferably do not travel under a wafer in order to place the contact pads 710-716 under a wafer or lift a wafer from a storage shelf. Maintaining the arms 702 and 704 on the outside of the wafer W eliminates the possibility that either of the arms 702 or 704 will contact and/or damage the surface of a wafer seated in the FOUP 10. The shape of the arms 702 and 704 shown in FIG. 10 is for exemplary purposes only.

The arms 702 and 704 may comprise other shapes and/or configurations.

The arms 702 and 704 of the end effector 700 also preferably contour around each tine 206. If the support pads 710-716 are active pads (e.g., able to move towards/away from the wafer's peripheral edge P), the end effector 700 may be placed into the FOUP enclosure 28 at any height and subsequently move vertically to another elevation within the FOUP 10 without having to first withdraw from the FOUP enclosure 28. With the support pads retracted, the end effector 700 may travel to its desired position. Once the end effector 700 reaches a desired location, the support pads 710-716 extend towards the wafer until a portion of each support pad 710-716 is located below the wafer W. This way, the wafer W will be supported (preferably in a horizontal orientation) when the end effector 700 lifts the wafer W off the tines 206 or storage shelf and removes the wafer W from the FOUP 10.

It should be appreciated that the above-described tine systems and end effectors are for explanatory purposes only and that the invention is not limited thereby. Having thus described a preferred embodiment of a tine system and end effector, it should be apparent to those skilled in the art that certain advantages of the within system have been achieved. It should also be appreciated that various modifications, adaptations, and alternative embodiments thereof may be made within the scope and spirit of the present disclosure. For example, the storage shelves and end effector have been illustrated in a semiconductor fabrication facility, but it should be apparent that many of the inventive concepts described above would be equally applicable to be used in connection with other non-semiconductor manufacturing applications. It should be apparent that the storage shelves are also not limited to workpiece carriers.

The invention claimed is:

1. An end effector comprising:
   a body;
   a first arm attached to and extending from the body in a direction,
   a second arm attached to and extending from the body in the direction;
   each of the first and second arms having a proximal end closer to the body than a distal end;
   a distal support pad extending from each of the first and second arms towards the other arm, the distal support pad located closer to the distal end than to the proximal end,
   wherein the distal support pads are located in a retracted position to facilitate travel of the first and second arms vertically within an enclosure of a container, wherein the distal support pads are located in a support position to support a workpiece when present in the container, wherein the first and second arms are configured to move closer or away from each other, wherein in the retracted position, the distal support pads are away from each other to not support the workpiece, and in the support position, the distal support pads are closer to each other to support the workpiece when present; and a finger extending from the body in the direction in which the first and second arms extend, wherein the finger extends between the first and second arms to be below a lower surface of the workpiece when present, wherein the finger has a finger support pad that extends from a top surface of the finger to support the workpiece when present.

2. The end effector of claim 1, wherein each of the first and second arms is curved between the proximal end and the distal end, wherein the body has a portion that is straight.

3. The end effector of claim 1, wherein the finger is straight and is located between the first and second arms, wherein the finger support pad extends from the finger towards the workpiece when present.

4. The end effector of claim 3, wherein the finger has a shorter length in the direction compared to a length of each of the first and second arms in the direction.

5. The end effector of claim 1, further comprising:
a first additional support pad extending from the first arm towards the second arm and located between the proximal end of the first arm and the distal end of the first arm;
a second additional support pad extending from the second arm towards the first arm and located between the proximal end of the second arm and the distal end of the second arm, wherein the first and second additional support pads are configured to support the workpiece when present, wherein the proximal end of each of the first and second arms is contiguous with the body.

6. The end effector of claim 5, wherein each of the distal support pads has a contact surface that extends in a horizontal direction and a backstop that extends in a vertical direction with respect to the contact surface of the distal support pad, wherein each of the first and second additional support pads has a contact surface that extends in the horizontal direction and a backstop that extends in the vertical direction with respect to each respective contact surface of the first and second additional support pads.

7. The end effector of claim 6, wherein each backstop of the distal support pads is configured to extend in the vertical direction to prevent the workpiece from sliding from each respective contact surface of the distal support pads, wherein each backstop of the first and second additional support pads is configured to extend in the vertical direction to prevent the workpiece from sliding from each respective contact surface of the first and second additional support pads.

8. A system comprising:
a container having a plurality of base members, the container further having a plurality of tines that extend from the base members into an interior space of the container; and
an end effector including:
a body;
a first arm attached to and extending from the body in a direction,
a second arm attached to and extending from the body in the direction;
each of the first and second arms having a proximal end closer to the body than a distal end;
a distal support pad extending from each of the first and second arms towards the other arm, the distal support pad located closer to the distal end than to the proximal end,
wherein the distal support pads are located in a retracted position to facilitate travel of the first and second arms vertically within the interior space of the container, wherein the distal support pads are located in a support position to support a workpiece when present in the container, wherein in the retracted position, the distal support pads are away from each other to not support the workpiece, and in the support position, the distal support pads are closer to each other to support the workpiece when present; and
a finger extending from the body in the direction in which the first and second arms extend, wherein the finger extends between the first and second arms to be below a lower surface of the workpiece when present, wherein the finger has a finger support pad that extends from a top surface of the finger to support the workpiece when present.

9. The system of claim 8, wherein each of the first and second arms is curved between the proximal end and the distal end, wherein the body has a portion that is straight.

10. The system of claim 8, wherein the finger is straight and is located between the first and second arms, wherein the finger support pad extends from the finger towards the workpiece when present.

11. The system of claim 10, wherein the finger has a shorter length in the direction compared to a length of each of the first and second arms in the direction.

12. The system of claim 8, wherein the end effector comprises:
a first additional support pad extending from the first arm towards the second arm and located between the proximal end of the first arm and the distal end of the first arm;
a second additional support pad extending from the second arm towards the first arm and located between the proximal end of the second arm and the distal end of the second arm, wherein the first and second additional support pads are configured to support the workpiece when present, wherein the proximal end of each of the first and second arms is contiguous with the body.

13. The system of claim 12, wherein each of the distal support pads has a contact surface that extends in a horizontal direction and a backstop that extends in a vertical direction with respect to the contact surface of the distal pad, wherein each of the first and second additional support pads has a contact surface that extends in the horizontal direction and a backstop that extends in the vertical direction with respect to each respective contact surface of the first and second additional support pads.

14. The system of claim 13, wherein each backstop of the distal support pads is configured to extend in the vertical direction to prevent the workpiece from sliding from each respective contact surface of the distal support pads, wherein each backstop of the additional support pads is configured to extend in the vertical direction to prevent the workpiece from sliding from the each respective contact surface of the first and second additional support pads.

15. An end effector comprising:
a body having a length that extends in a direction;
a first arm attached to and extending from the body in the direction,
a second arm attached to and extending from the body in the direction;
each of the first and second arms having a proximal end closer to the body than a distal end;

a distal support pad extending from each of the first and second arms towards the other arm, the distal support pad located closer to the distal end than to the proximal end, wherein the distal support pads are located in a retracted position to facilitate travel of the first and second arms vertically within an enclosure of a container, wherein the distal support pads are located in a support position to support a workpiece when present in the container, wherein in the retracted position, the distal support pads are away from each other to not support the workpiece, and in the support position, the distal support pads are closer to each other to support the workpiece when present; and a finger extending from the body in the direction in which the first and second arms extend, wherein the finger extends between the first and second arms to be below a lower surface of the workpiece when present, wherein the finger has a contact surface that extends from a top surface of the finger to support the workpiece when present.

16. The end effector of claim 15, wherein each of the first and second arms is curved between the proximal end and the distal end, wherein the body has a portion that is straight.

17. The end effector of claim 15, wherein the finger is straight and is located between the first and second arms, when the contact surface extends from the finger towards the workpiece when present.

18. The end effector of claim 17, wherein the finger has a shorter length in the direction compared to a length of each of the first and second arms in the direction.

19. The end effector of claim 15, further comprising:

a first additional support pad extending from the first arm towards the second arm and located between the proximal end of the first arm and the distal end of the first arm;

a second additional support pad extending from the second arm towards the first arm and located between the proximal end of the second arm and the distal end of the second arm, wherein the first and second additional support pads are configured to support the workpiece when present, wherein the proximal end of each of the first and second arms is contiguous with the body.

20. The end effector of claim 19, wherein each of the distal support pads has a contact surface that extends in a horizontal direction and a backstop that extends in a vertical direction with respect to the contact surface of the distal pad, wherein each of the first and second additional support pads has a contact surface that extends in the horizontal direction and a backstop that extends in the vertical direction with respect to each respective contact surface of the first and second additional support pads, wherein each backstop of the distal support pads is configured to extend in the vertical direction to prevent the workpiece from sliding from each respective contact surface of the distal support pads, wherein each backstop of the first and second additional support pads is configured to extend in the vertical direction to prevent the workpiece from sliding from the each respective contact surface of the first and second additional support pads.

* * * * *